US011990470B2

(12) United States Patent
Ando et al.

(10) Patent No.: US 11,990,470 B2
(45) Date of Patent: May 21, 2024

(54) FERROELECTRIC AND PARAELECTRIC STACK CAPACITORS

(71) Applicant: International Business Machines Corporation, Armonk, NY (US)

(72) Inventors: Takashi Ando, Eastchester, NY (US); Reinaldo Vega, Mahopac, NY (US); Cheng Chi, Jersey City, NJ (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 17/483,958

(22) Filed: Sep. 24, 2021

(65) Prior Publication Data
US 2023/0103003 A1     Mar. 30, 2023

(51) Int. Cl.
*H01L 27/08*     (2006.01)
*H01L 49/02*     (2006.01)

(52) U.S. Cl.
CPC .......... *H01L 27/0805* (2013.01); *H01L 28/60* (2013.01)

(58) Field of Classification Search
CPC ..................... H01L 21/76832; H01L 27/0805
USPC .......................... 257/303–307; 438/253, 396
See application file for complete search history.

(56) References Cited

U.S. PATENT DOCUMENTS

| | | | |
|---|---|---|---|
| 5,206,788 A * | 4/1993 | Larson .................... | H01L 28/55 257/295 |
| 5,717,234 A * | 2/1998 | Si .......................... | C23C 16/409 257/295 |
| 5,745,335 A * | 4/1998 | Watt ........................ | H01L 28/60 361/308.1 |
| 5,796,648 A * | 8/1998 | Kawakubo ............. | H01L 28/60 365/145 |
| 5,825,609 A | 10/1998 | Andricacos et al. | |
| 6,549,396 B2 * | 4/2003 | Brown ................ | H01L 27/0805 361/306.3 |
| 6,649,468 B2 * | 11/2003 | Schindler .......... | H01L 21/76832 257/295 |
| 6,844,581 B2 * | 1/2005 | Sitaram .............. | H01L 21/7687 257/295 |
| 8,008,161 B2 * | 8/2011 | Bachmann .......... | H01L 27/0805 257/E21.01 |
| 8,053,251 B2 * | 11/2011 | Dougherty ........ | H01L 27/11507 438/3 |
| 8,997,321 B2 * | 4/2015 | Komuro .................. | H01G 4/30 29/25.03 |
| 9,218,907 B2 | 12/2015 | Koutsaroff et al. | |

(Continued)

OTHER PUBLICATIONS

Sun, F. C., Kesim, M. T., Espinal, Y., & Alpay, S. P. (2016). Are ferroelectric multilayers capacitors in series? Journal of materials science, 51(1), 499-505.

(Continued)

*Primary Examiner* — Eugene Lee
(74) *Attorney, Agent, or Firm* — Patterson + Sheridan, LLP

(57) ABSTRACT

An apparatus includes a first plate, a second plate, a third plate, a ferroelectric dielectric, and a paraelectric dielectric. The ferroelectric dielectric is between the first plate and the second plate such that the first plate, the ferroelectric dielectric, and the second plate form a first capacitor. The paraelectric dielectric is between the second plate and the third plate such that the second plate, the paraelectric dielectric, and the third plate form a second capacitor.

17 Claims, 9 Drawing Sheets

(56) References Cited

U.S. PATENT DOCUMENTS

| | | | | |
|---|---|---|---|---|
| 9,305,709 | B2* | 4/2016 | Koutsaroff | H01L 27/016 |
| 9,620,581 | B2* | 4/2017 | Pelloquin | H01L 28/60 |
| 10,062,516 | B2* | 8/2018 | Kang | H01G 4/33 |
| 10,170,248 | B2* | 1/2019 | Kwong | H01L 23/535 |
| 10,282,108 | B2 | 5/2019 | Ryan et al. | |
| 10,923,286 | B2* | 2/2021 | Zelner | H01L 21/3115 |
| 2002/0155675 | A1* | 10/2002 | Hartner | H01L 28/40 |
| | | | | 257/E21.018 |
| 2012/0218733 | A1* | 8/2012 | Capanu | H01L 27/016 |
| | | | | 361/814 |
| 2014/0159200 | A1* | 6/2014 | Loke | H01L 28/60 |
| | | | | 257/532 |
| 2020/0286985 | A1* | 9/2020 | Lim | H01L 28/56 |
| 2022/0278191 | A1* | 9/2022 | Lai | H01L 21/76838 |

OTHER PUBLICATIONS

Lee, H. J., Park, M. H., Kim, G. H., Seok, J. Y., Kim, Y. J., Hwang, C. S., & Jiang, A. Q. (2011). Polarization switching and discharging behaviors in serially connected ferroelectric Pt/Pb (Zr, Ti) 03/Pt and paraelectric capacitors. Journal of Applied Physics, 109(11), 114113.
Jorel, C., Vallée, C., Gonon, P., Gourvest, E., Dubarry, C., & Defay, E. (2009). High performance metal-insulator-metal capacitor using a SrTiO 3/ZrO 2 bilayer. Applied Physics Letters, 94(25), 253502.
U.S. Appl. No. 17/341,489, entitled: "Multilayer Dielectric for Metal-Insulator-Metal Capacitor," filed Jun. 8, 2021.
Lin et al., "Reliability Characteristics of a High Density Metal-Insulator-Metal Capacitor on Intel's 10+ Process," Intel Corporation, dated Nov. 16, 2020, pp. 1-4.

* cited by examiner

FERROELECTRIC AND PARAELECTRIC STACK CAPACITORS

BACKGROUND

The present invention relates to stack capacitors, and more specifically, to stack capacitor structures for improving capacitance density.

SUMMARY

According to an embodiment, an apparatus includes a first plate, a second plate, a third plate, a ferroelectric dielectric, and a paraelectric dielectric. The ferroelectric dielectric is between the first plate and the second plate such that the first plate, the ferroelectric dielectric, and the second plate form a first capacitor. The paraelectric dielectric is between the second plate and the third plate such that the second plate, the paraelectric dielectric, and the third plate form a second capacitor. Other embodiments include a method for forming this apparatus.

According to another embodiment, an apparatus includes a first plate, a second plate, a third plate, a fourth plate, a fifth plate, a first ferroelectric dielectric, a second ferroelectric dielectric, a first paraelectric dielectric, and a second paraelectric dielectric. The first ferroelectric dielectric is between the first plate and the second plate. The second ferroelectric dielectric is between the second plate and the third plate such that the first plate, the first ferroelectric dielectric, the second plate, the second ferroelectric dielectric, and the third plate form a first capacitor. The first paraelectric dielectric is between the third plate and the fourth plate. The second paraelectric dielectric is between the fourth plate and the fifth plate such that the third plate, the first paraelectric dielectric, the fourth plate, the second paraelectric dielectric, and the fifth plate form a second capacitor. The apparatus may include any suitable number of ferroelectric dielectrics and paraelectric dielectrics positioned between plates. Other embodiments include a method for forming this apparatus.

DETAILED DESCRIPTION

Stack capacitors (e.g., capacitors with more than two electrodes) are used in various electrical applications. For example, these capacitors may be used as embedded dynamic random access memory capacitors or decoupling capacitors. To obtain sufficiently high capacitance density, three-dimensional capacitor structures have been implemented in these capacitors along with increasing the k-value of the insulators in the capacitors. There are limits, however, as to how many stacks can be built into a capacitor and as to how high the k-value can be, which limits the capacitance density of these capacitors.

This disclosure contemplates a stack capacitor structure with an increased capacitance density, in particular embodiments. The capacitor stacks metal-insulator-metal capacitors (MIMCaps) together to realize a capacitance boost. For example, the stack m at least one ferroelectric MIMCap (e.g., a capacitor structure with a ferroelectric dielectric that has a spontaneous electric polarization that can be reversed by application of an external electric field) and at least one paraelectric MIMCap (e.g., a capacitor structure with a paraelectric dielectric that becomes polarized under an applied electric field). For example, the capacitor may stack a paraelectric MIMCap on a ferroelectric MIMCap. The ferroelectric and paraelectric MIMCaps may share a metal plate. By stacking the paraelectric capacitor and the ferroelectric capacitor, the resulting structure provides a capacitance boost that increases the capacitance density, in certain embodiments.

Figure 1A:
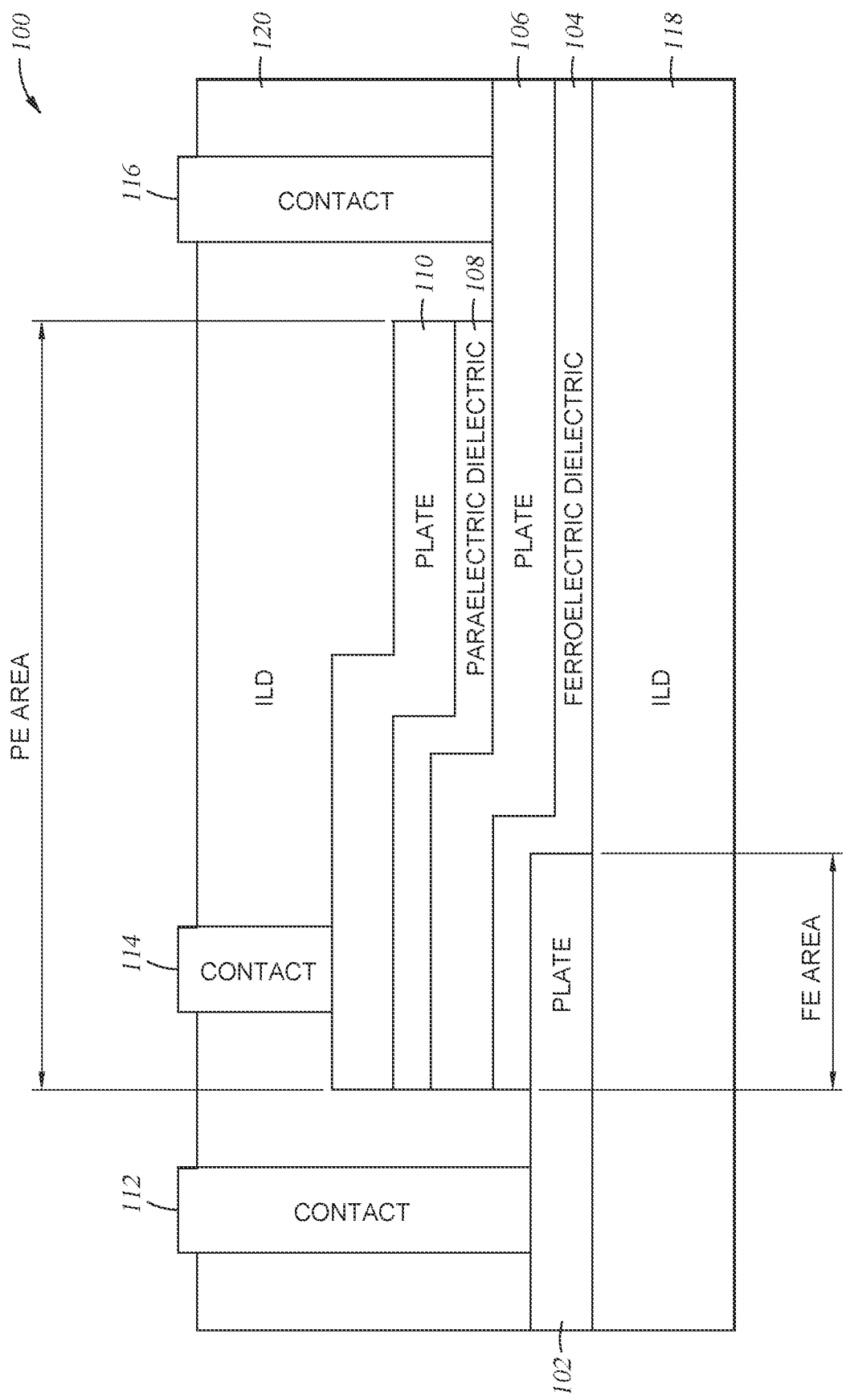
FIG. 1A illustrates an example device.

FIG. 1A illustrates an example device 100, which includes a stacked capacitor structure. Generally, the device 100 includes a paraelectric capacitor structure disposed on a ferroelectric capacitor structure. In particular embodiments, stacking the paraelectric capacitor structure and the ferroelectric capacitor structure increases the capacitance density of the device 100.

The device 100 includes a bottom plate 102, which may include any suitable conductive material or metal, such as titanium nitride. The device 100 also includes a ferroelectric dielectric 104 that is partially disposed on the bottom plate 102. The ferroelectric dielectric 104 may be any suitable ferroelectric insulative material that has a spontaneous electric polarization that can be reversed by application of an external electric field. For example, the ferroelectric dielectric 104 may include undoped, zirconium-doped, silicon-doped, aluminum-doped, yttrium-doped, lanthanum-doped, or gadolinium-doped hafnium oxide, or other doping species that crystallize hafnium oxide to orthorhombic phase with back end of line temperature, which may be less than 450 degrees Celsius with conventional anneal or a higher temperature with laser spike anneal or flash lamp anneal. As seen in FIG. 1A, a portion of the ferroelectric dielectric 104 is disposed on the plate 102. The ferroelectric dielectric 104 may not cover the entire top surface of the plate 102. Additionally, a portion of the ferroelectric dielectric 104 is disposed laterally to the plate 102. As seen in FIG. 1A, the ferroelectric dielectric 104 is also disposed adjacent to the plate 102 such that the ferroelectric dielectric 104 contacts a side surface of the plate 102. The ferroelectric dielectric 104 then extends laterally away from the plate 102.

A middle plate 106 is disposed on the ferroelectric dielectric 104. The middle plate 106 may include any suitable conductive material or metal, such as titanium nitride. As seen in FIG. 1A, the plate 106 extends across the width of the ferroelectric dielectric 104. The plate 106, the ferroelectric dielectric 104, and the plate 102 form a ferroelectric capacitor structure 124 in the region where the plate 102, the ferroelectric dielectric 104, and the plate 106 overlap. As seen in FIG. 1A, the region of overlap is labeled FE Area, which indicates the area of the ferroelectric capacitor structure 124. The FE Area may be increased by increasing the width of the region of overlap.

A paraelectric dielectric 108 is disposed on the plate 106. As seen in FIG. 1A, the paraelectric dielectric 108 has a shorter width than the plate 106 and the ferroelectric dielectric 104. As a result, the paraelectric dielectric 108 extends across only a portion of the width of the plate 106. The paraelectric dielectric 108 includes any suitable paraelectric insulative material that becomes polarized under an applied electrical field. For example, the paraelectric dielectric 108 may include one or more of hafnium oxide, aluminum oxide, zirconium dioxide, titanium dioxide, or tantalum pentoxide, along with amorphous or non-ferroelectric crystalline phases. A top plate 110 is disposed on the paraelectric dielectric 108. The top plate 110 includes any suitable conductive material or metal, such as titanium nitride. As seen in FIG. 1A, the plate 110 extends across the width of the paraelectric dielectric 108.

The top plate 110, the paraelectric dielectric 108, and the middle plate 106 form a paraelectric dielectric structure 122 in the region where the top plate 110, the paraelectric dielectric 108, and the middle plate 106 overlap. The region of overlap is labeled PE Area, which indicates the area of the paraelectric capacitor structure 122. As a result, the ferroelectric capacitor structure 124 and the paraelectric capacitor structure 122 share the middle plate 106. Additionally, the paraelectric capacitor structure 122 is stacked on the ferroelectric capacitor structure 124. In certain embodiments, stacking the paraelectric capacitor structure 122 and the ferroelectric capacitor structure 124 increases the capacitance density of the device 100.

The area of the ferroelectric capacitor structure 124 and the area of the paraelectric capacitor structure 122 may be controlled by adjusting the widths of one or more of the bottom plate 102, the ferroelectric dielectric 104, the middle plate 106, the paraelectric dielectric 108, and the top plate 110 during fabrication of the device 100. In certain embodiments, the ratio of the FE Area to the PE Area is used for capacitance matching (e.g., to manage negative capacitance effects). Additionally, in some embodiments, the thickness of the paraelectric dielectric 108 may be increased to relax or reduce the maximum charge of the paraelectric capacitor structure 122.

The device 100 includes electrical contacts to each of the bottom plate 102, the middle plate 106, and the top plate 110. As seen in FIG. 1A, the device 100 includes a contact 112 to the bottom plate 102, a contact 114 to the top plate 110, and a contact 116 to the middle plate 106. Each of the contacts 112, 114 and 116 allow an electrical connection to be made to the bottom plate 102, the top plate 110, and the middle plate 106, respectively. Additionally, each contact 112, 114 and 116 extends upwards in the stack to the top of the device 100.

Different connections may be made to the electrical contacts 112, 114, and 116 to build different circuits using the device 100. For example, connections may be made to the electrical contacts 112 and 114 to create a circuit in which the paraelectric capacitor structure 122 and the ferroelectric capacitor structure 124 are arranged in series. This circuit experiences a high capacitance density and a lower operational voltage. As another example, connections may be made to the electrical contacts 112 and 116 to create a circuit that includes the ferroelectric capacitor structure 124 but not the paraelectric capacitor structure 122. As a result, this circuit has a high operational voltage and a low capacitance density. As yet another example, connections may be made to the electrical contacts 114 and 116 to create a circuit that includes the paraelectric capacitor structure 122 but not the ferroelectric capacitor structure 124.

In certain embodiments, the device 100 includes interlayer dielectrics (ILDs) that prevent electrical current from flowing between certain components of the device 100, or between the device 100 and an adjacent device. As seen in FIG. 1A, the device 100 includes an ILD 118 that forms the foundation of the device 100. The plate 102 and the ferroelectric dielectric 104 are disposed on the ILD 118. The width of the ILD 118 may be greater than or equal to the width of the bottom plate 102 and the ferroelectric dielectric 104. Additionally, the device 100 includes an ILD 120 that fills the space between the contacts 112, 114, and 116. The ILD 120 also covers the exposed top surfaces of the bottom plate 102, the top plate 110, and the middle plate 106.

Figure 1B:
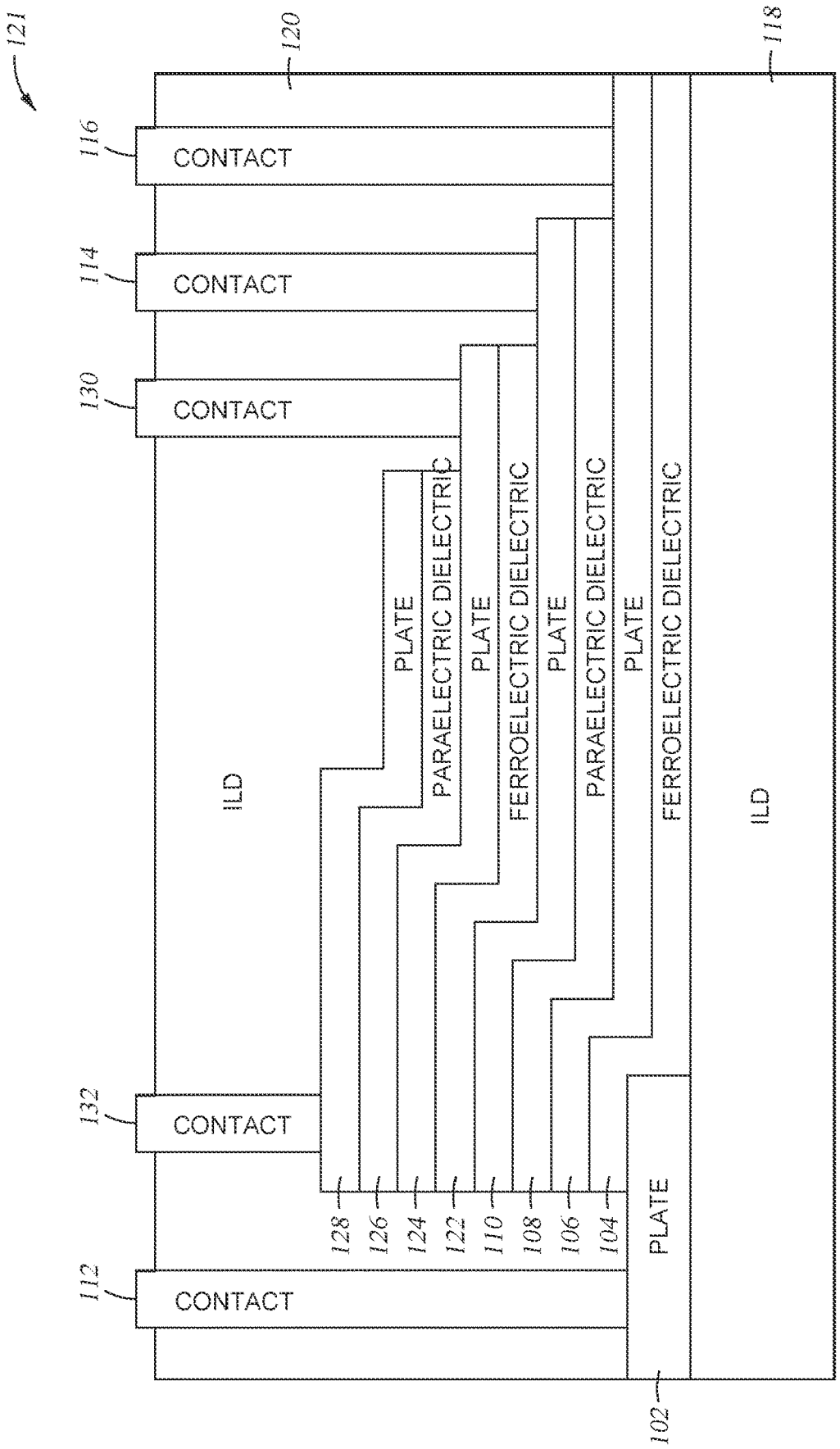
FIG. 1B illustrates an example device.

Any number of ferroelectric dielectric layers and paraelectric dielectric layers may be added to the device 100. FIG. 1B illustrates an example device 121 that includes additional ferroelectric dielectric layers and paraelectric dielectric layers. As seen in FIG. 1B, the device 121 includes a ferroelectric dielectric 122 formed on the plate 110. A plate 124 is formed on the ferroelectric dielectric 122. The plate 124, ferroelectric dielectric 122, and plate 110 form a second ferroelectric capacitor structure. Additionally, a paraelectric dielectric 126 is formed on the plate 124, and a plate 128 is formed on the paraelectric dielectric 126. The plate 128, paraelectric dielectric 126, and plate 124 form a second paraelectric capacitor structure. Additional contacts 130 and 132 are formed to the plates 124 and 128 so that electrical connections can be made to the plates 124 and 128.

Figure 2A:
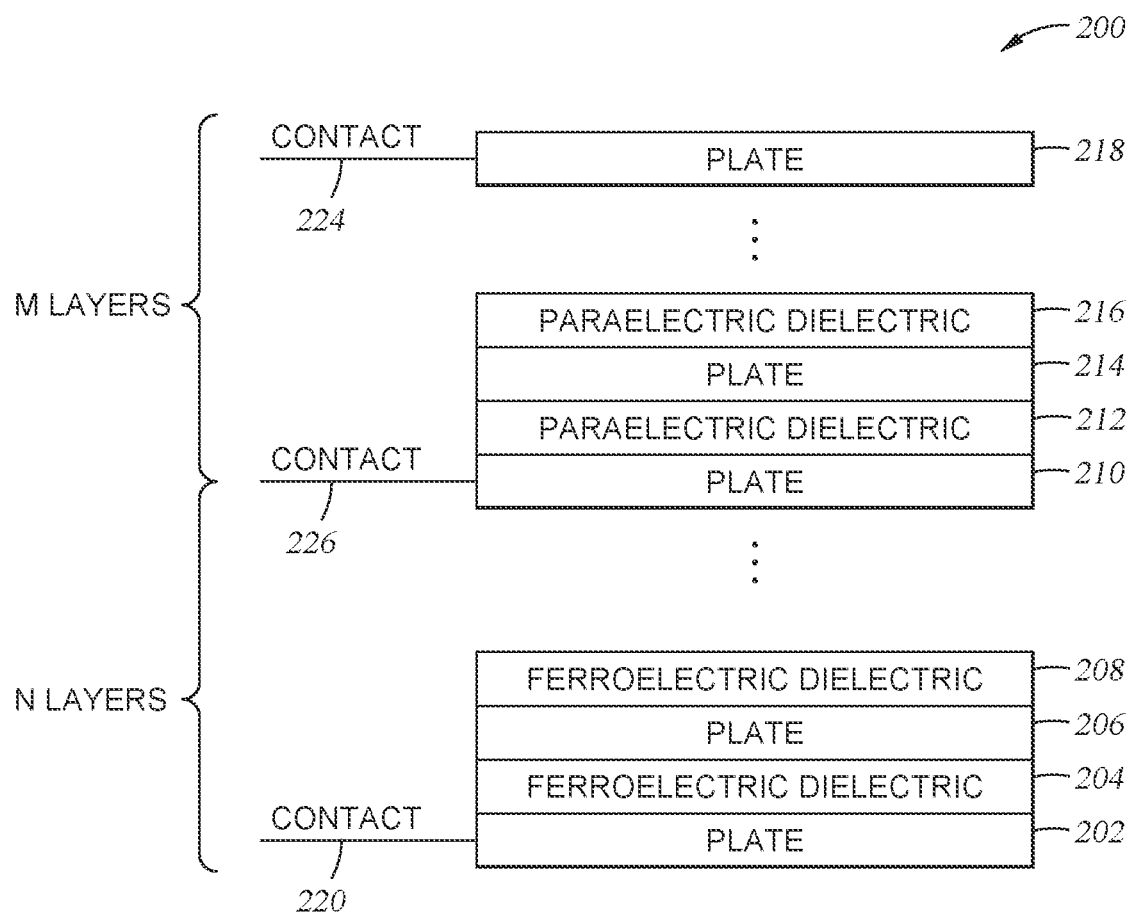
FIG. 2A illustrates an example device.

FIG. 2A illustrates an example device 200, which includes a stacked paraelectric capacitor and ferroelectric capacitor. In certain embodiments, stacking the paraelectric capacitor and the ferroelectric capacitor increases the capacitance density of the device 200. The device 200 may be an alternative to the bottom plate 102, ferroelectric dielectric 104, middle plate 106, paraelectric dielectric 108, top plate 110 assembly in the device 100 of FIG. 1A. Notably, the device 200 increases the number of layers of ferroelectric dielectric and paraelectric dielectric. Each of the layers in the device 200 may have the same width. Instead of adjusting the widths of the ferroelectric dielectric and paraelectric dielectric during fabrication, in the device 200, the number of layers of ferroelectric dielectric and paraelectric dielectric is adjusted during fabrication. Additionally, each of the layers in the device 200 may include the same materials used for the corresponding layers in the device 100.

The device 200 includes a ferroelectric capacitor formed using multiple ferroelectric dielectric layers. As seen in FIG. 2A, the device 200 includes a plate 202, and a ferroelectric dielectric 204 disposed on the plate 202. Additionally, the device 200 includes a plate 206 disposed on the ferroelectric dielectric 204, and a ferroelectric dielectric 208 disposed on the plate 206. Any suitable number of layers of plates and ferroelectric dielectrics may be stacked on each other to form a ferroelectric capacitor in the device 200. In the example of FIG. 2A, the ferroelectric capacitor structure includes N layers of plates and ferroelectric dielectrics. Notably, the plate 210 is the top plate of the ferroelectric capacitor structure in the device 200. The ferroelectric dielectrics in the device 200 may include any of the materials used for the ferroelectric dielectric 104 in the device 100 of FIG. 1A. The plates in the ferroelectric capacitor structure may include any conductive material or metal, such as titanium nitride.

The device 200 also includes a paraelectric capacitor structure with multiple paraelectric dielectrics. As seen in FIG. 2A, a paraelectric dielectric 212 is disposed on the plate 210. A plate 214 is disposed on the paraelectric dielectric 212, and a paraelectric dielectric 216 is disposed on the plate 214. Any suitable number of layers of plates and paraelectric dielectrics may be stacked on each other to form the paraelectric capacitor structure in the device 200. In the example of FIG. 2A, the paraelectric capacitor structure includes M layers of plates and paraelectric dielectrics. The plate 218 is the top plate of the paraelectric capacitor in the device 200, and the plate 210 is shared by the ferroelectric capacitor structure and the paraelectric capacitor structure. The paraelectric dielectrics in the device 200 may include any of the materials used for the paraelectric dielectric 108 in the device 100 of FIG. 1A. The plates in the paraelectric capacitor structure may include any conductive material or metal, such as titanium nitride.

In certain embodiments, electrical contacts may be made with the plate 202, the plate 210 and the plate 218. As seen in FIG. 2A, the device 200 includes a contact 220 to the plate 202, a contact 222 to the plate 210, and a contact 224 to the plate 218. Connections may be made to the contacts 220 and 222 to create a circuit that includes the ferroelectric capacitor structure but not the paraelectric capacitor structure. The ferroelectric capacitor structure includes the bottom end layers of the device 200. Connections may be made to the contacts 220 and 224 to create a circuit that includes the paraelectric capacitor structure in series with the ferroelectric capacitor structure. The circuit includes the M layers of the paraelectric capacitor structure in series with the N layers of the ferroelectric capacitor structure. As a result, this circuit has increased capacitance density per area and a lower operational voltage. As yet another example, connections may be made to the contact 222 and the contact 224 to create a circuit that includes the paraelectric capacitor structure, but not the ferroelectric capacitor structure. Notably, the circuit includes the M layers of the paraelectric capacitor structure in the device 200. As a result, this circuit has a lower capacitance density per area and a higher operational voltage. In certain embodiments, the ratio of M to N is used for capacitance matching (e.g., to manage the negative capacitance effect).

Figure 2B:
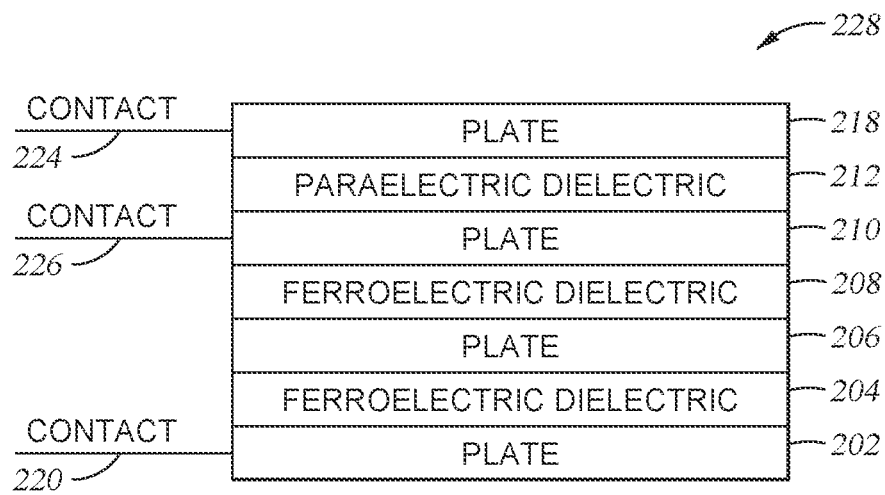
FIG. 2B illustrates an example device.
Figure 2C:
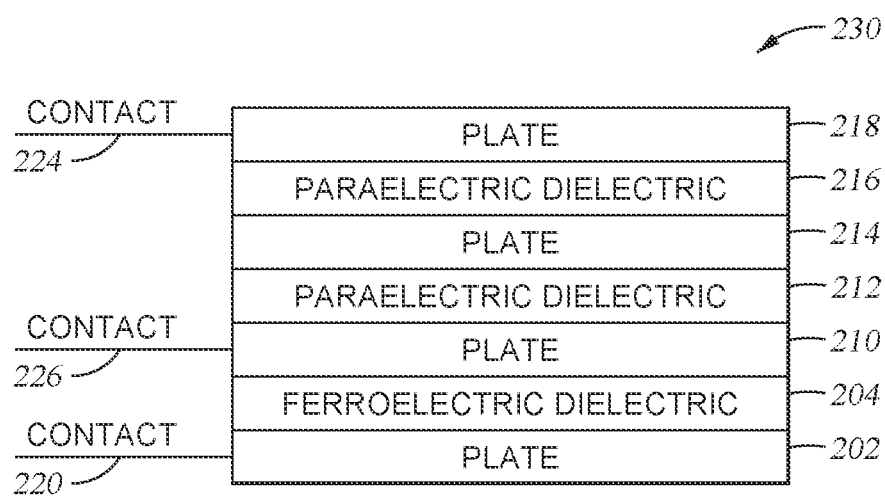
FIG. 2C illustrate an example device.

M and N may be different numbers. FIG. 2B illustrates an example device 228 that includes two ferroelectric dielectric layers and one paraelectric dielectric layer. Specifically, the ferroelectric dielectric 204 is formed on the plate 202, and the ferroelectric layer 208 is formed on the plate 206. The paraelectric dielectric 212 is formed on the plate 210, which is shared by the ferroelectric capacitor structure and the paraelectric capacitor structure. FIG. 2C illustrates an example device 230 that includes one ferroelectric dielectric layer and two paraelectric dielectric layers. Specifically, the ferroelectric dielectric 204 is formed on the plate 202. The paraelectric dielectric 212 is formed on the plate 210, which is shared by the ferroelectric capacitor structure and the paraelectric capacitor structure. The paraelectric dielectric 216 is formed on the plate 214.

Figure 3:
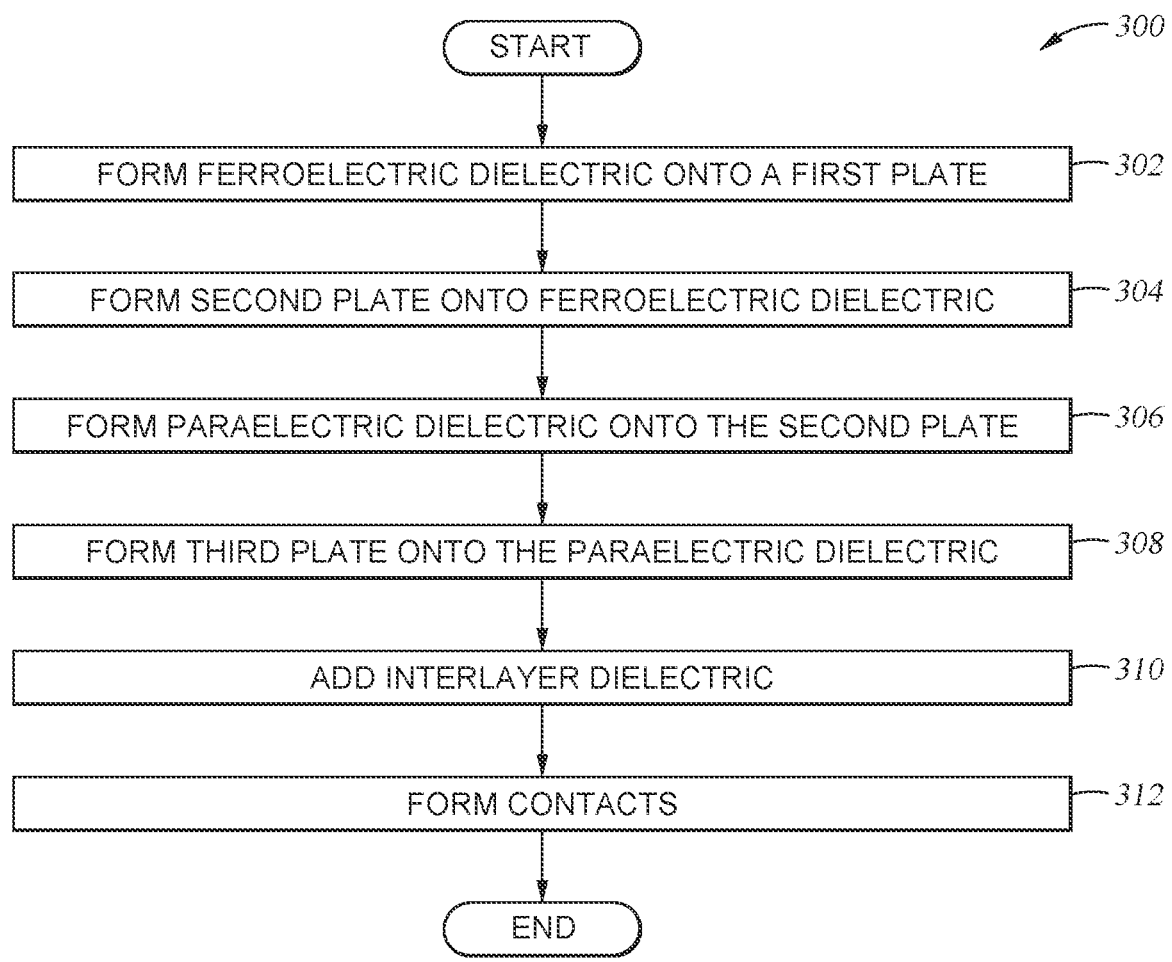
FIG. 3 is a flowchart of an example method for forming the device of FIG. 1A, 1B, 2A, 2B, or 2C.

FIG. 3 is a flowchart of an example method 300 for forming the device 100 of FIG. 1A, the device 121 of FIG. 1B, the device 200 of FIG. 2A, the device 228 of FIG. 2B, or the device 230 of FIG. 2C. In certain embodiments, semiconductor fabrication machines or an operator perform the method 300. By performing the method 300, a paraelectric capacitor structure is stacked on a ferroelectric capacitor structure, which increases the capacitance density of the resulting device.

In block 302 a ferroelectric dielectric is formed onto a first plate (e.g., by deposition). In the examples of FIGS. 1A and 1B, the first plate may be the plate 102 and the ferroelectric dielectric may be the ferroelectric dielectric 104. In the examples of FIGS. 2A, 2B, and 2C, the first plate may be the plate 202 and the ferroelectric dielectric may be the ferroelectric dielectric 204. In particular embodiments, a crystallization anneal process is then performed on the ferroelectric dielectric. In block 304, a second plate is formed onto the ferroelectric dielectric (e.g., by deposition). In the examples of FIGS. 1A and 1B, the second plate may be the middle plate 106. In the examples of FIGS. 2A and 2B, the second plate may be the plate 206. In the example of FIG. 2C, the second plate may be the plate 210. When forming the devices 200 and 228 in FIGS. 2A and 2B, the blocks 302 and 304 may be repeated several times to create the multiple layers (e.g., N layers) of the ferroelectric capacitor structure.

In block 306, a paraelectric dielectric is formed onto the second plate (e.g., by deposition). In the examples of FIGS. 1A and 1B, the paraelectric dielectric is the paraelectric dielectric 108. In the examples of FIGS. 2A, 2B, and 2C, the paraelectric dielectric is the paraelectric dielectric 212. In certain embodiments, a crystallization anneal process is then performed on the paraelectric dielectric. In block 308, a third plate is formed onto the paraelectric dielectric (e.g., by deposition). In the examples of FIGS. 1A and 1B, the third plate is the plate 110. In the examples of FIGS. 2A and 2C, the third plate is the plate 214. In the example of FIG. 2B, the third plate is the plate 218. When creating the devices 200 and 230 in FIGS. 2A and 2C, the blocks 306 and 308 may be repeated several times to create the multiple layers (e.g., M layers) of the paraelectric capacitor structure.

In block 310, ILD is added to prevent electric current from flowing between certain components. In block 312, contacts are formed to one or more of the plates in the device. In the examples of FIGS. 1A and 1B, the contacts 112, 114 and 116 are formed through the ILD 120 to contact the bottom plate 102, the top plate 110, and the middle plate 106, respectively. In the examples of FIGS. 2A, 2B, and 2C, the contacts 220, 222, and 224 are formed to contact the plates 202, 210 and 218, respectively.

Figure 4A:
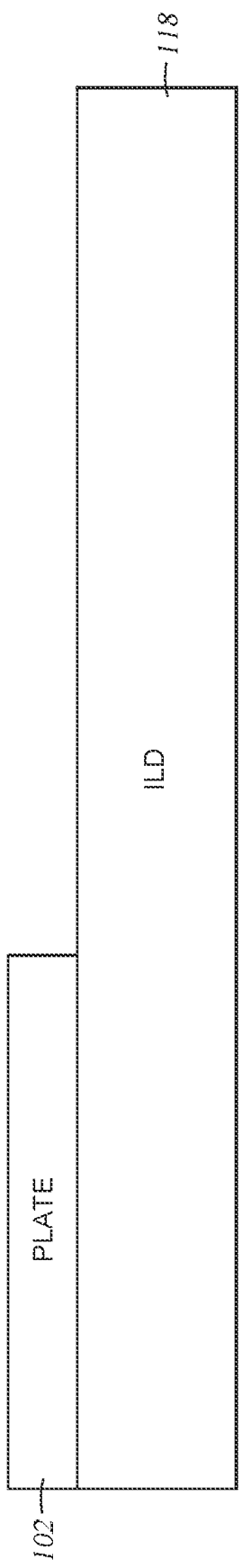
FIG. 4A illustrates an example step in forming the device of FIG. 1A.
Figure 4B:
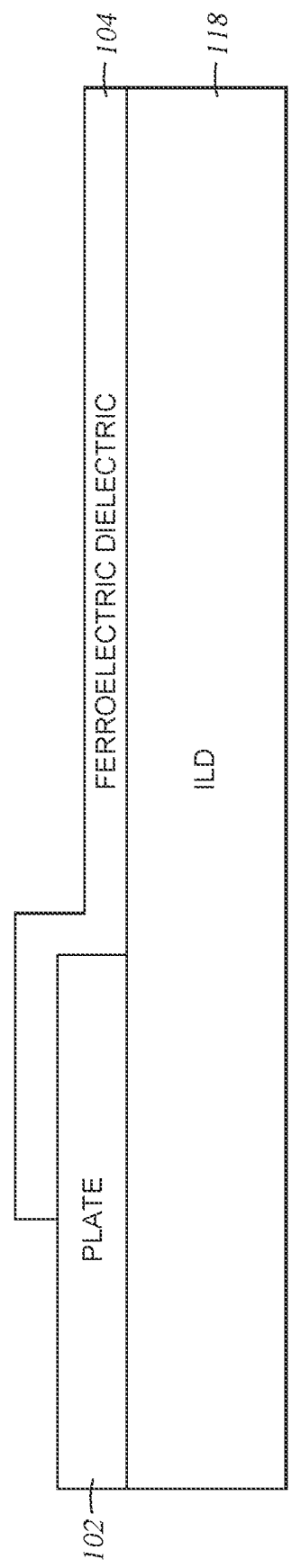
FIG. 4B illustrates an example step in forming the device of FIG. 1A.

FIGS. 4A through 4F illustrate the process of forming the device 100 of FIG. 1A. As seen in FIG. 4A, the process begins when the bottom plate 102 is formed onto the ILD 118. The plate 102 extends across a portion of the width of the ILD 118. As seen in FIG. 4B, after the plate 102 is formed onto the ILD 118, the ferroelectric dielectric 104 is formed onto the plate 102 and the ILD 118. The ferroelectric dielectric 104 and the plate 102 may combine to extend across the width of the ILD 118. Additionally, a portion of the ferroelectric dielectric 104 is formed onto the plate 102. The ferroelectric dielectric 104 extends across a portion of the width of the plate 102. Additionally, a portion of the ferroelectric dielectric 104 is adjacent to the plate 102 such that the ferroelectric dielectric 104 contacts the side surface of the plate 102. The ferroelectric dielectric 104 then extends laterally away from the plate 102.

Figure 4C:
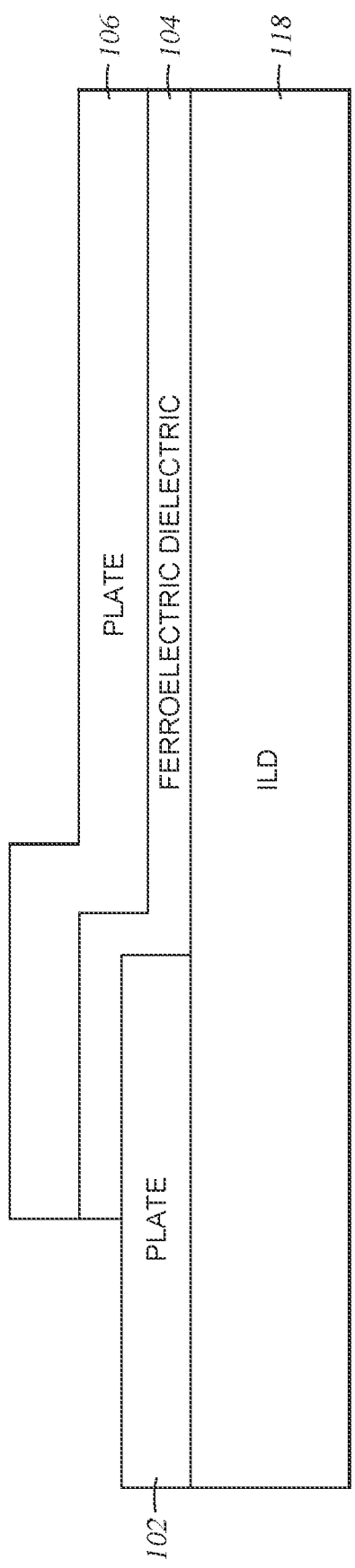
FIG. 4C illustrates an example step in forming the device of FIG. 1A.

As seen in FIG. 4C, the plate 106 is then formed onto the ferroelectric dielectric 104. The plate 106 may have the same width as the ferroelectric dielectric 104. As a result, the plate 102, the ferroelectric dielectric 104, and the plate 106 form the ferroelectric capacitor structure 124 in the region of overlap for the plate 102, the ferroelectric dielectric 104 and the plate 106.

Figure 4D:
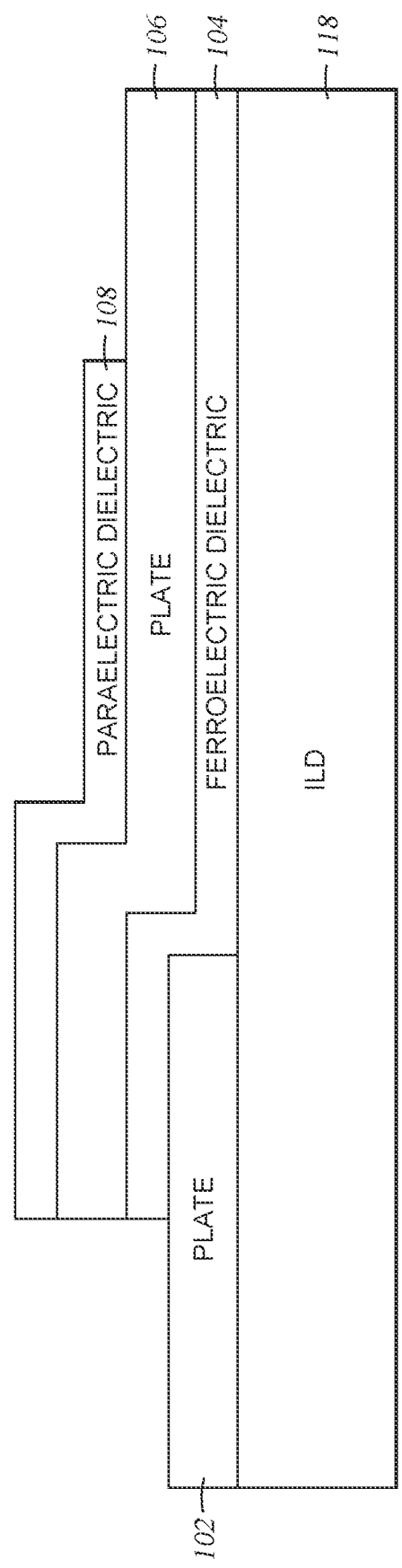
FIG. 4D illustrates an example step in forming the device of FIG. 1A.
Figure 4E:
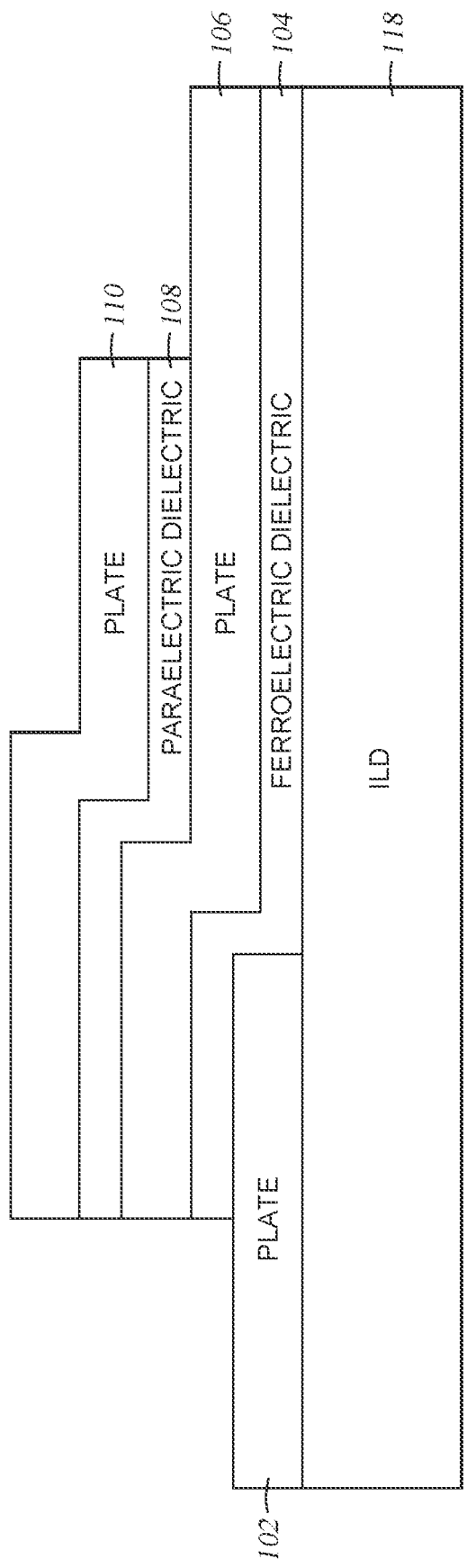
FIG. 4E illustrates an example step in forming the device of FIG. 1A.

As seen in FIG. 4D, a paraelectric dielectric 108 is formed onto the plate 106. The paraelectric dielectric 108 extends across a portion of the width of the plate 106. As seen in FIG. 4E, after the paraelectric dielectric 108 is formed onto the plate 106, the plate 110 is formed onto the paraelectric dielectric 108. The plate 110 has the same width as the paraelectric dielectric 108. As a result, the plate 110, the paraelectric dielectric 108, and the plate 106 form the paraelectric capacitor structure 122 in the region of overlap for the plate 106, the paraelectric dielectric 108, and the plate 110.

Figure 4F:
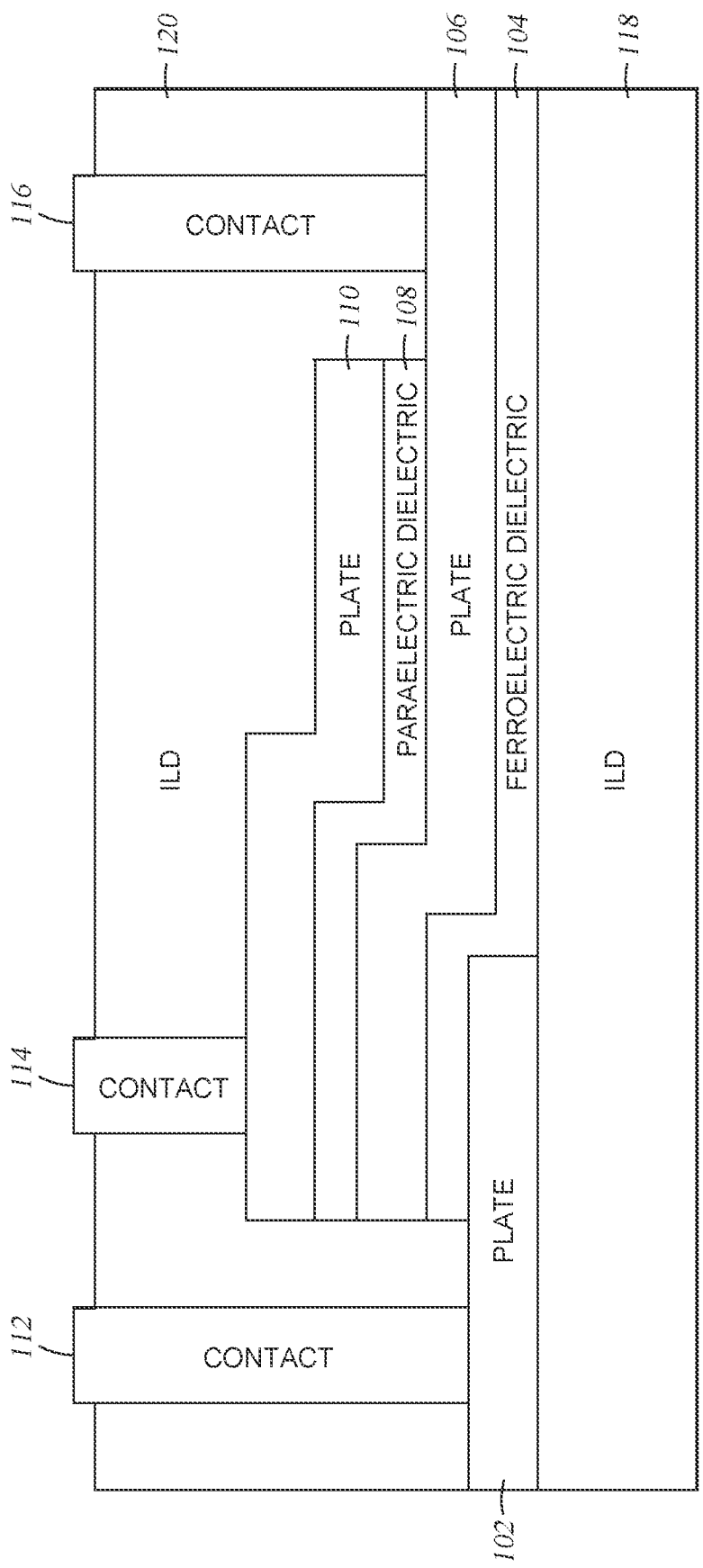
FIG. 4F illustrates an example step in forming the device of FIG. 1A.

As seen in FIG. 4F, after the plate 110 is formed onto the paraelectric dielectric 108, ILD 120 is added to cover exposed surfaces of the plate 102, the plate 110, and the plate 106. Contacts 112, 114 and 116 are then formed through the ILD 120 to the plate 102, the plate 110 and the plate 106, respectively. The contacts 112, 114 and 116 allow electrical connections to be made to the plate 102, the plate 110 and the plate 106.

In summary, a stacked capacitor includes at least one ferroelectric MIMCap and at least one paraelectric MIMCap to increase capacitance density, in certain embodiments. For example, the capacitor may include a paraelectric MIMCap stacked on a ferroelectric MIMCap. The ferroelectric and paraelectric MIMCaps may share a metal plate. Additionally, the ferroelectric MIMCap may include one or more ferroelectric dielectric layers, and the paraelectric MIMCap may include one or more paraelectric dielectric layers. In some embodiments, the capacitor structure is implemented in CMOS technology (e.g., 5 nm and beyond) without additional materials development.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. An apparatus comprising:
  a first plate;
  a second plate;
  a third plate;
  a fourth plate;
  a ferroelectric dielectric positioned between the first plate and the second plate such that the first plate, the ferroelectric dielectric, and the second plate form a first capacitor;
  a first paraelectric dielectric physically separated from the ferroelectric dielectric and positioned between the second plate and the third plate; and
  a second paraelectric dielectric physically separated from the first paraelectric dielectric and positioned between the third plate and the fourth plate such that the second plate, the first paraelectric dielectric, the third plate, the second paraelectric dielectric, and the fourth plate form a second capacitor, and such that the first capacitor and the second capacitor share the second plate.

2. The apparatus of claim 1, further comprising an interlayer dielectric, wherein the first plate, the second plate, the third plate, and the fourth plate are positioned within the interlayer dielectric.

3. The apparatus of claim 2, further comprising:
  a first contact formed through the interlayer dielectric such that the first contact connects to the first plate;
  a second contact formed through the interlayer dielectric such that the second contact connects to the second plate; and
  a third contact formed through the interlayer dielectric such that the third contact connects to the fourth plate.

4. The apparatus of claim 1, wherein the second plate and the third plate extend laterally beyond the first plate such that a first area of overlap between the first plate and the second plate is smaller than a second area of overlap between the second plate and the third plate.

5. The apparatus of claim 1, wherein the ferroelectric dielectric comprises doped hafnium oxide, and wherein the first paraelectric dielectric comprises hafnium oxide.

6. The apparatus of claim 1, further comprising:
  a fifth plate; and
  a second ferroelectric dielectric between the fifth plate and the first plate.

7. The apparatus of claim 1, wherein the ferroelectric dielectric is adjacent to the first plate.

8. A method comprising:
  forming a ferroelectric dielectric onto a first plate
  forming a second plate onto the ferroelectric dielectric such that the first plate, the ferroelectric dielectric, and the second plate form a first capacitor;
  forming a first paraelectric dielectric onto the second plate such that the first paraelectric dielectric is physically separated from the ferroelectric dielectric;
  forming a third plate onto the first paraelectric dielectric;
  forming a second paraelectric dielectric onto the third plate such that the second paraelectric dielectric is physically separated from the first paraelectric dielectric; and
  forming a fourth plate onto the second paraelectric dielectric such that the second plate, the first paraelectric dielectric, and the third plate, the second paraelectric dielectric, and the fourth plate form a second capacitor, and such that the first capacitor and the second capacitor share the second plate.

9. The method of claim 8, further comprising adding an interlayer dielectric, wherein the first plate, the second plate, the third plate, and the fourth plate are positioned within the interlayer dielectric.

10. The method of claim 9, further comprising:
  forming a first contact through the interlayer dielectric such that the first contact connects to the first plate;

forming a second contact through the interlayer dielectric such that the second contact connects to the second plate; and forming a third contact through the interlayer dielectric such that the third contact connects to the fourth plate.

11. The method of claim 8, wherein the second plate and the third plate extend laterally beyond the first plate such that a first area of overlap between the first plate and the second plate is smaller than a second area of overlap between the second plate and the third plate.

12. The method of claim 8, wherein the ferroelectric dielectric comprises doped hafnium oxide, and wherein the first paraelectric dielectric comprises hafnium oxide.

13. The method of claim 8, wherein the ferroelectric dielectric is adjacent to the first plate.

14. An apparatus comprising:
a first plate;
a second plate;
a third plate;
a fourth plate;
a fifth plate;
a first ferroelectric dielectric positioned between the first plate and the second plate;
a second ferroelectric dielectric positioned between the second plate and the third plate such that the first plate, the first ferroelectric dielectric, the second plate, the second ferroelectric dielectric, and the third plate form a first capacitor;
a first paraelectric dielectric physically separated from the second ferroelectric dielectric and positioned between the third plate and the fourth plate; and
a second paraelectric dielectric physically separated from the first paraelectric dielectric and positioned between the fourth plate and the fifth plate such that the third plate, the first paraelectric dielectric, the fourth plate, the second paraelectric dielectric, and the fifth plate form a second capacitor, and such that the first capacitor and the second capacitor share the third plate.

15. The apparatus of claim 14, further comprising:
a first contact connecting to the first plate;
a second contact connecting to the third plate; and
a third contact connecting to the fifth plate.

16. The apparatus of claim 14, wherein the first plate, the second plate, the third plate, the fourth plate, and the fifth plate have the same length and width.

17. The apparatus of claim 16, wherein the first ferroelectric dielectric, the second ferroelectric dielectric, the first paraelectric dielectric, and the second paraelectric dielectric have the same length and width.

* * * * *